United States Patent [19]

Parker et al.

[11] Patent Number: 5,260,979
[45] Date of Patent: Nov. 9, 1993

[54] CIRCUIT AND METHOD OF SWITCHING BETWEEN REDUNDANT CLOCKS FOR A PHASE LOCK LOOP

[75] Inventors: Lanny L. Parker, Mesa; Ahmad H. Atriss, Chandler, both of Ariz.; Dean W. Mueller, Portland, Oreg.

[73] Assignee: Codex Corp., Mansfield, Mass.

[21] Appl. No.: 705,861

[22] Filed: May 28, 1991

[51] Int. Cl.$^5$ .............................................. H04L 7/00
[52] U.S. Cl. .................... 375/108; 375/120; 331/18; 331/25; 371/22.1; 371/31
[58] Field of Search .............. 331/7, 11, 18, 49, 25; 371/68.1, 7, 31, 24, 22.1, 47.1, 67.1, 6, 62; 375/81, 82, 108, 119, 120, 118

[56] References Cited
U.S. PATENT DOCUMENTS

| 4,144,448 | 3/1979 | Pisciotta et al. | 371/62 |
| 4,392,226 | 7/1983 | Cook | 371/62 |
| 4,718,389 | 1/1988 | Hönig et al. | 371/62 |
| 4,908,841 | 3/1990 | Leis et al. | 375/81 |
| 4,918,404 | 4/1990 | Vitiello et al. | 331/11 |
| 4,964,117 | 10/1990 | Shier | 375/120 |
| 4,972,442 | 11/1990 | Steierman | 375/120 |

Primary Examiner—Stephen Chin
Assistant Examiner—Don N. Vo
Attorney, Agent, or Firm—Robert D. Atkins

[57] ABSTRACT

A phase lock loop monitors the frequency of redundant input clock signals and switches back and forth therebetween should one or the other become invalid. Thus, the PLL may continue normal operation even with a failure of one input clock signal. If both the input clock signals fail, an internal reference signal maintains the PLL at a nominal operating frequency until one of the input clock signals is restored whereby the loop can quickly re-establish phase lock. To determined validity, the input clock signals are sampled and stored by the reference signal in a predetermined manner. The input clock signal is valid if the samples of the input clock signal each have the same logic state after the sampling period; otherwise, the input clock signal is invalid if the samples of the input clock signal have at least one different logic state after the sampling period.

18 Claims, 8 Drawing Sheets

CIRCUIT AND METHOD OF SWITCHING BETWEEN REDUNDANT CLOCKS FOR A PHASE LOCK LOOP

CROSS REFERENCE TO RELATED PATENT APPLICATIONS

This application is related to copending U.S. patent application Ser. No. 07/695,118, Attorney's Docket CX07235, entitled "LOCK DETECTION FOR A PHASE LOCK LOOP", filed May, 3, 1991 which are now abandoned, by Lanny Parker et al and assigned to the same assignee, Codex, Corp. This application is further related to copending U.S. patent application Ser. No. 07/705,862, Attorney's Docket CX07236, entitled "CIRCUIT AND METHOD OF DETECTING AN INVALID CLOCK SIGNAL", filed May, 28, 1991 which are now U.S. Pat. No. 5,161,175, by Lanny Parker et al and assigned to the same assignee, Codex, Corp.

FIELD OF THE INVENTION

This invention relates in general to phase lock loops and, more particularly, to a phase lock loop capable of switching between redundant input clock signals.

BACKGROUND OF THE INVENTION

Phase lock loops (PLL) are found in a myriad of electronic applications, such as communication receivers and clock synchronization circuits in computer systems, for providing a reference signal with a known phase for clocking incoming and out-going data. A conventional PLL comprises a phase detector for monitoring the phase difference between an input clock signal and the output signal of a voltage controlled oscillator (VCO) and generating an UP control signal and a DOWN control signal for a charge pump circuit which charges and discharges a loop filter at the input of the VCO. The UP and DOWN control signals drive the VCO to maintain a predetermined phase relationship between signals applied to the phase detector, as is well understood.

The output signal of the PLL must maintain a predetermined frequency of operation to be useful as a reference for clocking the incoming and out-going data. If the frequency of the input clock signal should drift, or even change to a radically different rate, the output signal of the VCO follows along and attempts to re-achieve phase lock thereto. Such behavior is inherent in the operation of the PLL. Many prior art systems have ways of detecting and reporting a momentary loss of phase lock. Yet, most if not all conventional phase lock indicators cannot distinguish the input frequency. Therefore, the output signal of the VCO locks to the new, albeit incorrect, frequency of the input clock signal and the lock indicator again reports a valid phase lock status. The reference signal thus clocks the incoming and out-going data at the wrong points resulting in erroneous communication.

The input clock signal may also become stuck-at-one or stuck-at-zero causing the PLL to permanently lose phase lock. Since the PLL cannot lock to a DC signal, the lock indicator suspends the system operation. While it is informative to know of the permanent loss of phase lock, the phase lock indicator does nothing toward restoring operation of the system which may remain down until the input clock signal is repaired. In many applications, it is desirable and even imperative that the PLL remain operational even if the primary input clock signal becomes invalid as a reference.

Hence, what is needed is an improved phase lock loop which re-establishes operation should the primary input clock signal become invalid.

SUMMARY OF THE INVENTION

Briefly stated, the invention comprises a method of selecting between first and second input clock signals applied to a phase lock loop (PLL) comprising the steps of checking validity of the first input clock signal by counting pulses of a first reference signal during first and second states of one period of the first input clock signal and locking the PLL to the first input clock signal if valid as indicated by a predetermined number of pulses of the reference signal occurring during the first and second states of the one period of the first input clock signal, switching to the second input clock signal if the first input clock signal becomes invalid, and checking validity of the second input clock signal by counting pulses of a second reference signal during first and second states of one period of the second input clock signal and locking the PLL to the second input clock if valid.

In another aspect, the present invention is a phase lock loop (PLL) responsive to a first digital signal for generating a second digital signal operating substantially at frequency and in-phase with the first digital signal. A first circuit is responsive to first and second control signals for selecting between first and second input clock signals respectively applied at first and second inputs thereof for providing the first digital signal of the PLL at an output, while a second circuit monitors the validity of the first and second input clock signals and activating the first control signal when the first input clock signal is valid and activating the second control signal when the first input clock signal is invalid.

Thus, one advantage of the present invention is the technique of monitoring the input clock signal and substituting a redundant clock signal therefor should the primary input clock signal become invalid. If both the primary and redundant input clock signals fail, an internal oscillator maintains the PLL at nominal operating frequency until one of the input clock signal is restored whereby the loop can quickly re-establish phase lock.

DETAILED DESCRIPTION OF THE PREFERRED EMBODIMENT

Figure 1:
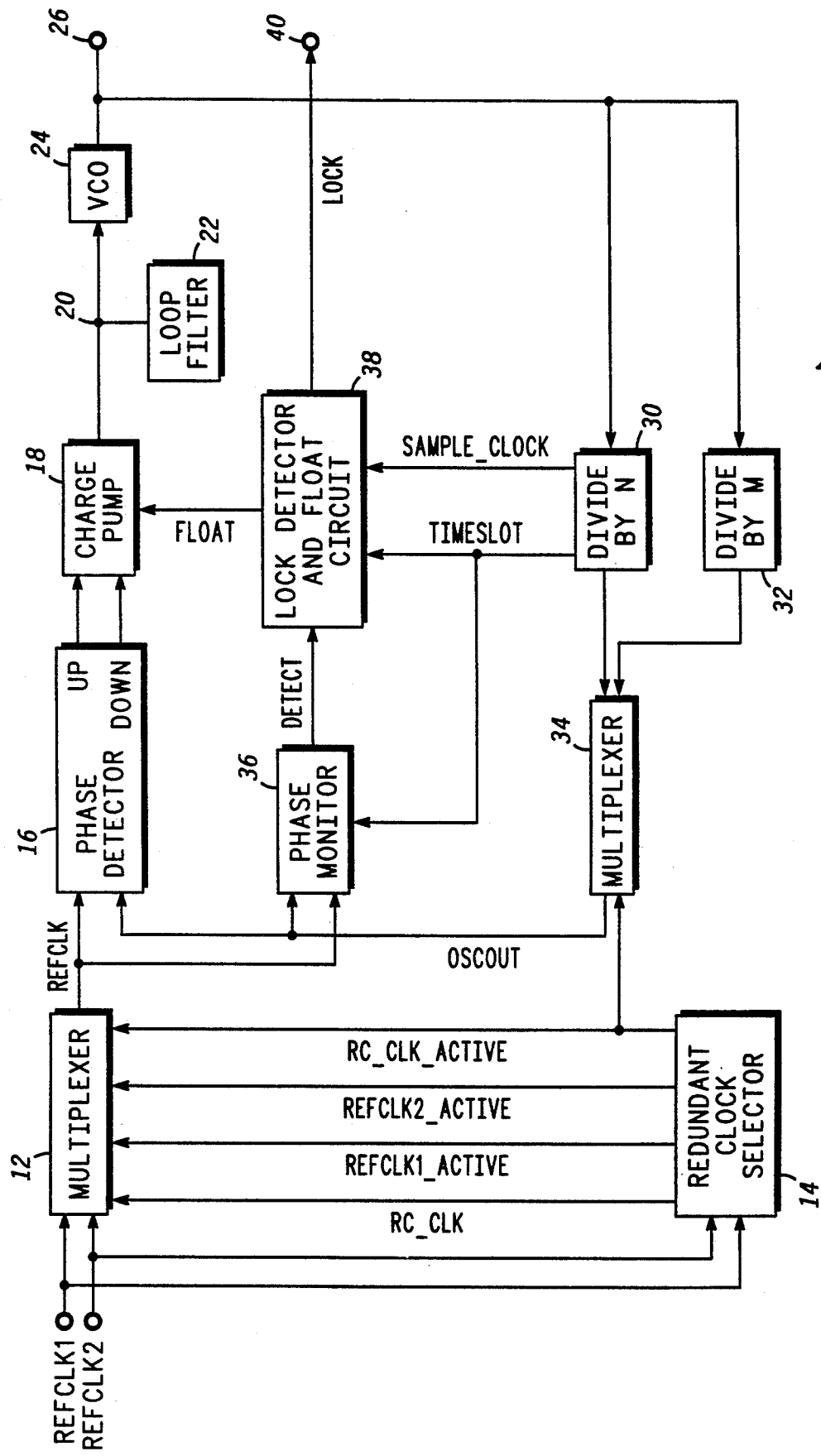
FIG. 1 is a simplified block diagram illustrating a phase lock loop with redundant input clocks.

A phase lock loop (PLL) 10 in accordance with the present invention is shown in FIG. 1 suitable for manufacturing as an integrated circuit using conventional integrated circuit processes. One usage for PLL 10 is in a communication system such as a telecommunications network manager. A primary REFCLK1 input clock signal and a redundant REFCLK2 input clock signal are applied at first and second inputs of multiplexer 12 and to first and second inputs of redundant clock selector 14, the latter of which provides an RC_CLK reference clock signal to the third input of multiplexer 12 and control signals REFCLK1_ACTIVE, REFCLK2_ACTIVE and RC_CLK_ACTIVE for controlling multiplexer 12. The REFCLK1 and REFCLK2 clock signals operate at the same frequency, say about four megahertz (MHz), although not necessarily in-phase. The RC_CLK clock signal is generated in redundant clock selector 14 and cycles at approximately 500 kilo-hertz (KHz) ±20%.

The REFCLK1_ACTIVE, REFCLK2_ACTIVE and RC_CLK_ACTIVE control signals are mutually exclusive in that only one is asserted at a time for passing one of the input clock signals REFCLK1, REFCLK2 or RC_CLK through multiplexer 12 to the first input of phase detector 16. The REFCLK1 clock signal is routed through multiplexer 12 becoming the REFCLK clock signal to phase detector 16 when the REFCLK1_ACTIVE signal is asserted. Alternately, the REFCLK2 clock signal is passed through as the REFCLK clock signal when the REFCLK2_ACTIVE signal is active, while the RC_CLK_ACTIVE signal enables the RC_CLK clock signal to become the REFCLK clock signal.

The REFCLK clock signal applied at the first input of phase detector 16 generates an UP control signal and a DOWN control signal for charge pump 18 which charges and discharges loop node 20. Loop filter 22 may comprise a capacitor (not shown) coupled between loop node 20 and ground potential. The voltage at loop node 20 controls VCO 24 for generating an oscillator signal at output 26 operating at say 24 MHz. The VCO oscillator signal is divided through divide-by-N circuit 30 in one path and through divide-by-M circuit 32 in another path for providing an OSCOUT signal at the output of multiplexer 34. The RC_CLK_ACTIVE signal controls multiplexer 34 for selecting the proper division of the VCO oscillator signal at the second input of phase detector 16 to lock to the 4 MHz REFCLK1/REFCLK2 clock signal, or the 500 KHz RC_CLK clock signal. A typical value for "N" is six to match with the 4 MHz REFCLK1 and REFCLK2 clock signals, while "M" is set to forty-eight for aligning with the 500 KHz RC_CLK clock signal.

The operation of PLL 10 proceeds as follows. The REFCLK clock signal applied at the first input of phase detector 16 in combination with the OSCOUT signal applied at the second input of the same generates an UP control signal, or a DOWN control signal, according to the phase relationship therebetween. The UP control signal pulses if the OSCOUT signal lags the REFCLK clock signal, i.e, the frequency of the OSCOUT signal is too low relative to the REFCLK clock signal. Alternately, the DOWN control signal pulses to reduce the frequency of the oscillator signal from VCO 24 if the OSCOUT signal leads the REFCLK clock signal.

Charge pump 18 is responsive to the UP control signal and the DOWN control signal for charging and discharging loop node 20 under the influence of loop filter 22. The voltage developed at loop node 20 drives VCO 24 to generate the 24 MHz oscillator signal which is divided down by divide-by-N circuit 30, or divide-by-M circuit 32, for providing the OSCOUT signal at the second input of phase detector 16. Thus, phase detector 16 monitors the phase difference between the REFCLK clock signal and the OSCOUT signal and generates UP and DOWN control signals as necessary for charge pump 18 to drive loop node 20 and VCO 24 to maintain the predetermined phase relationship between the REFCLK and OSCOUT signals.

PLL 10 also includes phase monitor 36 responsive to the REFCLK clock signal and the OSCOUT signal for comparing the phase difference and generating a true DETECT signal if the phase difference occurs within a predetermined TIMESLOT window as established by divide-by-N circuit 30. The DETECT signal is false if the phase difference between the REFCLK and OSCOUT signals extends beyond the TIMESLOT window. The operation of phase monitor 36 and divide-by-N circuit 30 is described in the copending patent application entitled "LOCK DETECTION FOR A PHASE LOCK LOOP" as noted in the cross reference to related patent applications. The TIMESLOT signal operates at twice the frequency of the OSCOUT signal with its low state centered about the transitions of the OSCOUT signal. The low state of the TIMESLOT signal defines the TIMESLOT window having a duration of say 20 nanoseconds compared to the overall period of the REFCLK clock signal of 250 nanoseconds. The SAMPLE_CLOCK signal operates at the same frequency as the TIMESLOT signal with a positive pulse just prior to the falling edge of the TIMESLOT signal.

Lock detector and float circuit 38 counts a predetermined number of repetitive true DETECT signals and generates a LOCK signal indicating PLL 10 is phase locked. The FLOAT signal from lock detector and float circuit 38 disables charge pump 18 immediately upon losing the input clock signal to maintain loop node 20 stationary until the redundant input clock can take over.

A key feature is the ability to detect the validity of the REFCLK1 clock signal and the REFCLK2 clock signal and route one or the other to phase detector 16 to maintain the operation of PLL 10. Thus, if the REFCLK1 clock signal becomes invalid, such an occurrence is detected by redundant clock selector 14 and the REFCLK2 clock signal is promptly substituted therefor to allow continued operation of PLL 10. Since the external circuitry (not shown) generating the REFCLK1 clock signal is separate and distinct from that generating the REFCLK2 clock signal, the likelihood of both REFCLK1 and REFCLK2 clock signals becoming invalid at the same time is relatively low. However, should such a condition occur, the RC_CLK clock signal is routed through multiplexer 12 to phase detector 16 for maintaining a nominal voltage at loop node 20 in the vicinity of that needed for the 24 MHz oscillator signal from VCO 24 such that if and when the REFCLK1 and/or REFCLK2 clock signals return, PLL 10 can re-achieve phase lock as rapidly as possible. The RC_CLK clock signal is generated locally on chip and, therefore, known to be good, stable and very reliable. There is a high probability that at least one of the three input clock signals is operating to drive PLL 10.

Figure 2:
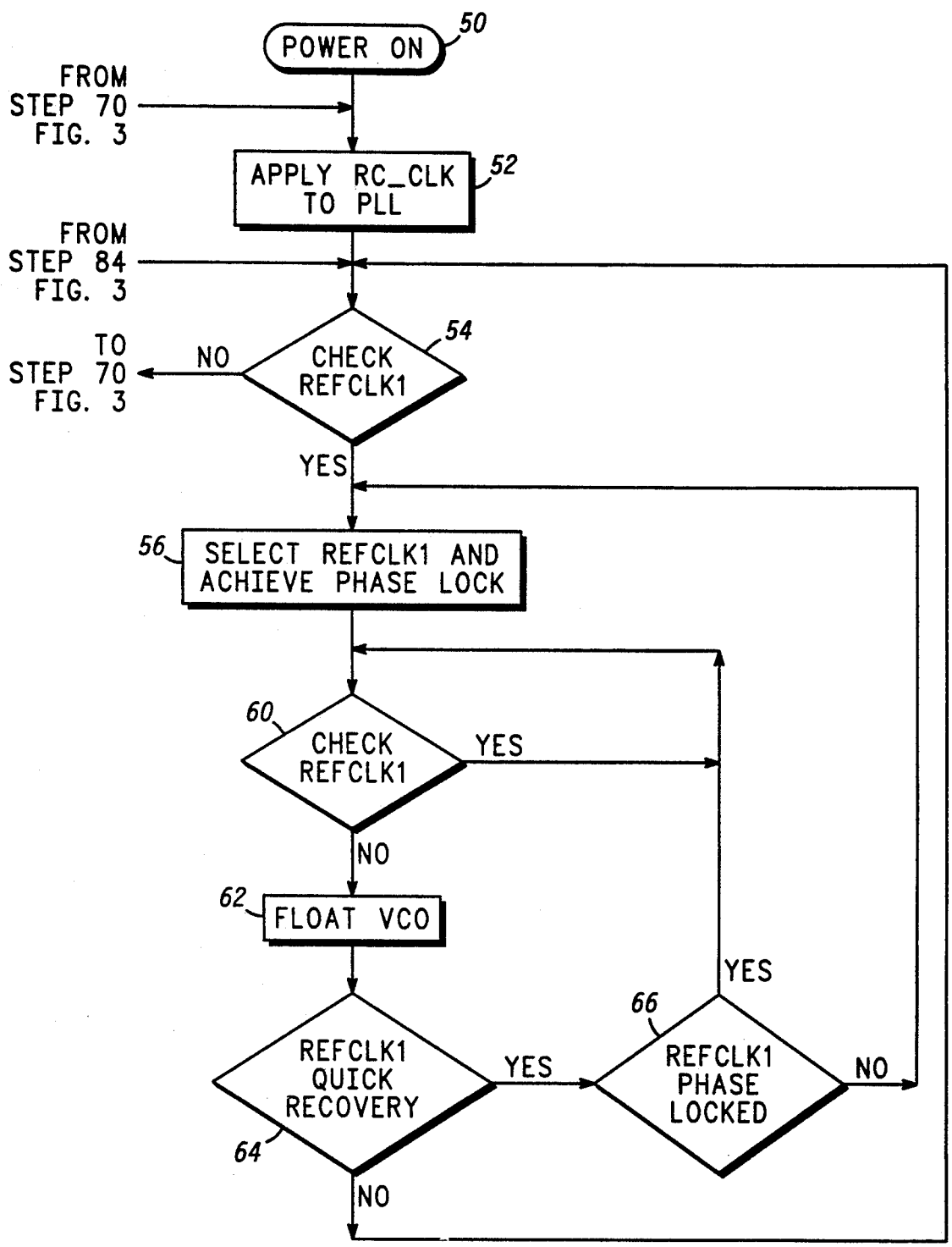
FIGS. 2 and 3 is a flow chart illustrating a method of switching between redundant input clocks.

Before preceding with a detailed description of the circuit structure of PLL 10, it may be helpful to understand the logical steps of selecting between the REFCLK1 clock signal, the REFCLK2 clock signal and the RC_CLK clock signal during the operation of PLL 10. Referring to FIG. 2, the selection process begins with POWER ON step 50 where system power is initially applied to PLL 10, or system reset is actuated. At system reset, APPLY RC_CLK TO PLL step 52 routes the RC_CLK clock signal through multiplexer 12 and allows PLL 10 to train thereto. That is, the voltage at loop node 20 moves to a nominal value close to that needed for the REFCLK1 and REFCLK2 clock signals. CHECK REFCLK1 step 54 determines the validity of the REFCLK1 clock signal and precedes to SELECT REFCLK1 AND ACHIEVE PHASE LOCK step 56 for a valid REFCLK1 clock signal. The REFCLK1 clock signal is routed through multiplexer 12 allowing PLL 10 to lock thereto and begin normal operation.

CHECK REFCLK1 step 60 continuously monitors the REFCLK1 clock signal until an invalid status is detected at which time FLOAT VCO step 62 disables charge pump 18 to maintain loop node 20 in a floating condition. If the REFCLK1 clock signal recovers quickly, say in less than seven RC_CLK cycles, REFCLK1 QUICK RECOVERY step 64 verifies the recovery of the REFCLK1 clock signal and proceeds to REFCLK1 PHASE LOCKED step 66 which returns the loop to CHECK REFCLK1 step 60 if PLL 10 is still phase locked with the REFCLK1 clock signal. The logic assumes that by floating loop node 20, VCO 24 keeps operating at substantially the same frequency for at least seven periods of the RC_CLK clock signal. Thus, if the REFCLK1 clock signal recovers quickly, PLL 10 can continue operating at step 60 where it left off. Otherwise, if PLL 10 is not phase locked with the REFCLK1 clock signal, REFCLK1 PHASE LOCKED step 66 returns to step 56 to re-achieve phase lock. If the REFCLK1 clock signal does not recover quickly, the logic returns to step 54 to verify that the REFCLK1 clock signal is indeed defective.

Figure 3:
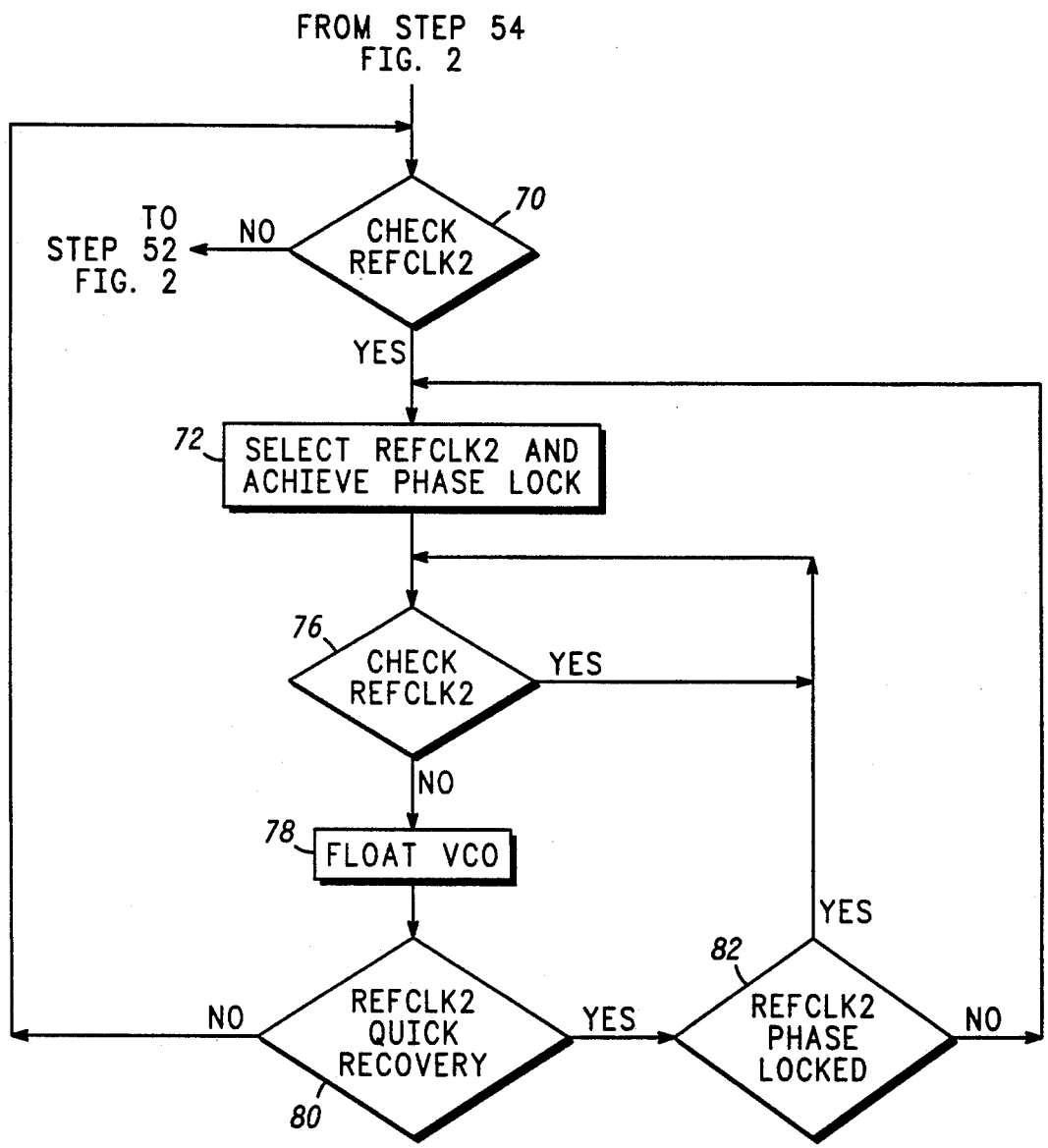

Continuing onto FIG. 3, if the REFCLK1 clock signal fails the initial check at step 54, or fails to recover in the allotted time at step 64, the logic checks the validity of the REFCLK2 clock signal in CHECK REFCLK2 step 70. An invalid REFCLK2 clock signal returns PLL 10 to step 52 allowing the loop to maintain nominal operation with the RC_CLK clock signal until such time as one or both input clock signals REFCLK1/REFCLK2 return. A valid REFCLK2 clock signal is routed through multiplexer 12 allowing PLL 10 lock thereto as indicated in SELECT REFCLK2 AND ACHIEVE PHASE LOCK step 72. CHECK REFCLK2 step 76 continuously monitors the REFCLK2 clock signal until an invalid status is detected at which time FLOAT VCO step 78 disables charge pump 18 to maintain loop node 20 in a floating condition. If the REFCLK2 clock signal recovers quickly, say in less than seven RC_CLK cycles, REFCLK2 QUICK RECOVERY step 80 verifies the recovery of the REFCLK2 clock signal and proceeds to REFCLK2 PHASE LOCKED step 82 which returns the loop to CHECK REFCLK2 step 76 if PLL 10 is still phase locked with the REFCLK2 clock signal. Again, if PLL 10 is not phase locked with the REFCLK2 clock signal, REFCLK2 PHASE LOCKED step 82 returns to step 72 to re-achieve phase lock. If the REFCLK2 clock signal does not recover quickly, the logic returns to step 70 to verify that the REFCLK2 clock signal is indeed bad and forces a switch to CHECK REFCLK1 step 54 to see if REFCLK1 has been operating for at least seven RC_CLK periods and, if so, returns control to steps 56–60. An invalid REFCLK1 clock signal brings the logic through step 70 back to step 52 where it cycles waiting for repair, although still operating with the RC_CLK clock signal.

Figure 4:
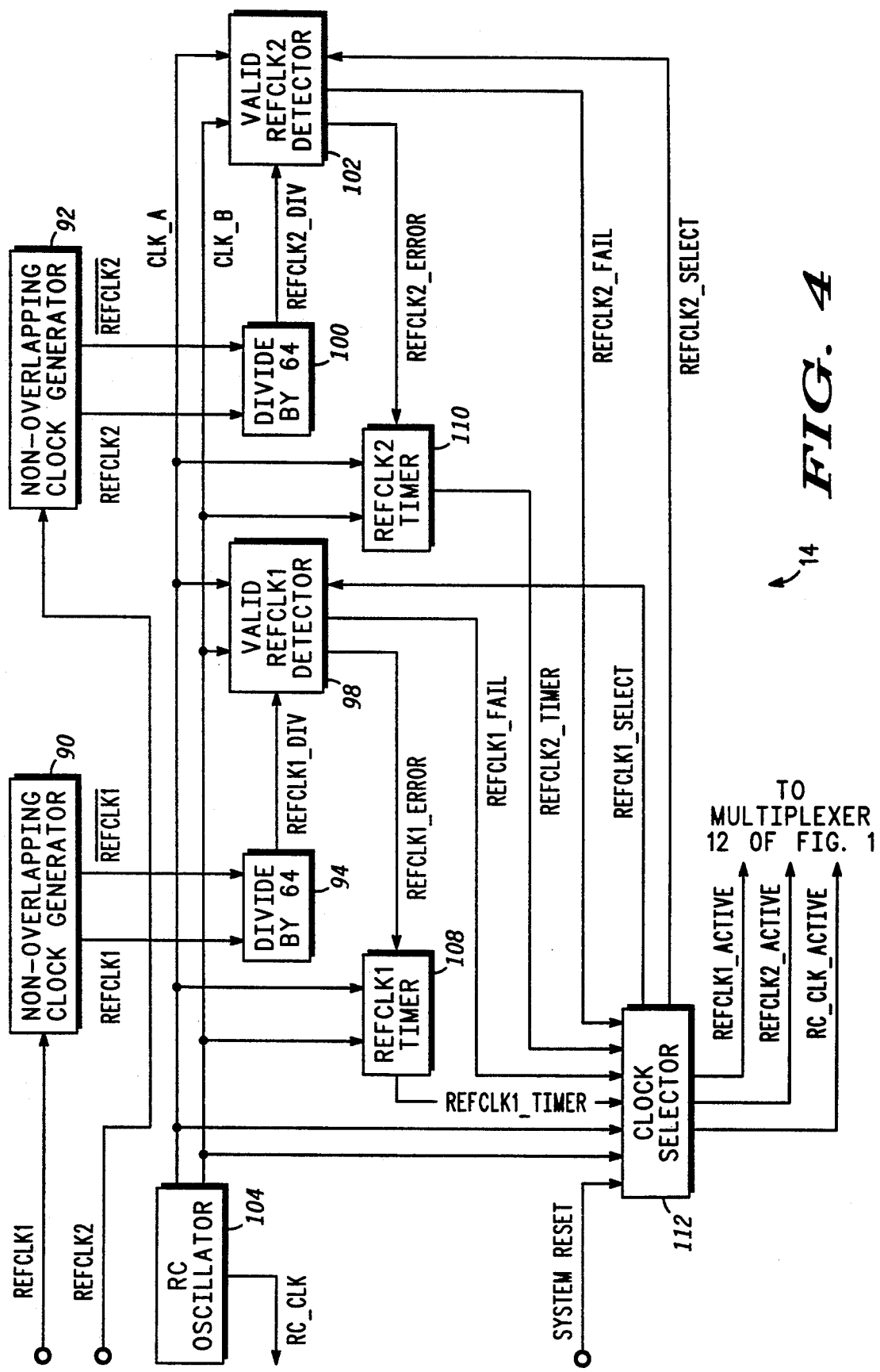
FIG. 4 is a simplified block diagram illustrating the redundant clock selector of FIG. 1.

Turning to FIG. 4, there is shown further detail of redundant clock selector 14 including non-overlapping clock generator 90 coupled for receiving the REFCLK1 clock signal and non-overlapping clock generator 92 coupled for receiving the REFCLK2 clock signal. Non-overlapping clock generators 90 and 92 each provide complementary output clock signals; one operating in-phase with the respective input clock signal and one operating out-of-phase from the input signal. The output clock signals of non-overlapping clock generators 90 and 92, such as REFCLK1 and $\overline{\text{REFCLK1}}$, are never logic one at the same time. The same is true for REFCLK2 and $\overline{\text{REFCLK2}}$. Divide-by-64 circuit 94 divides the output clock signals of non-overlapping clock generator 90 for providing a REFCLK1_DIV clock signal operating at approximately 64 KHz to valid REFCLK1 detector 98. Likewise, divide-by-64 circuit 100 receives the output clock signals of non-overlapping clock generator 92 and applies the resultant 64 KHz REFCLK2_DIV signal to valid REFCLK2 detector 102.

Redundant clock selector 14 also includes RC oscillator 104 for providing a CLK_A signal and a CLK_B signal to valid REFCLK1 detector 98 and to valid REFCLK2 detector 102. The CLK_A and CLK_B signals are also applied to REFCLK1 timer 108 and REFCLK2 timer 110. Clock selector 112 receives multiple input signals from the output of REFCLK1 timer 108 and REFCLK2 timer 110, a SYSTEM RESET signal, the CLK_A and CLK_B signals, the REFCLK1_FAIL signal from valid REFCLK1 detector 98 and the REFCLK2_FAIL signal from valid REFCLK2 detector 102 for generating the REFCLK1_ACTIVE signal, the REFCLK2_ACTIVE signal and the RC_CLK_ACTIVE signal for multiplexer 12 of FIG. 1. Furthermore, clock selector 112 provides a REFCLK1_SELECT signal for valid REFCLK1 detector 98 and a REFCLK2_SELECT signal for valid REFCLK2 detector 102.

Figure 5:
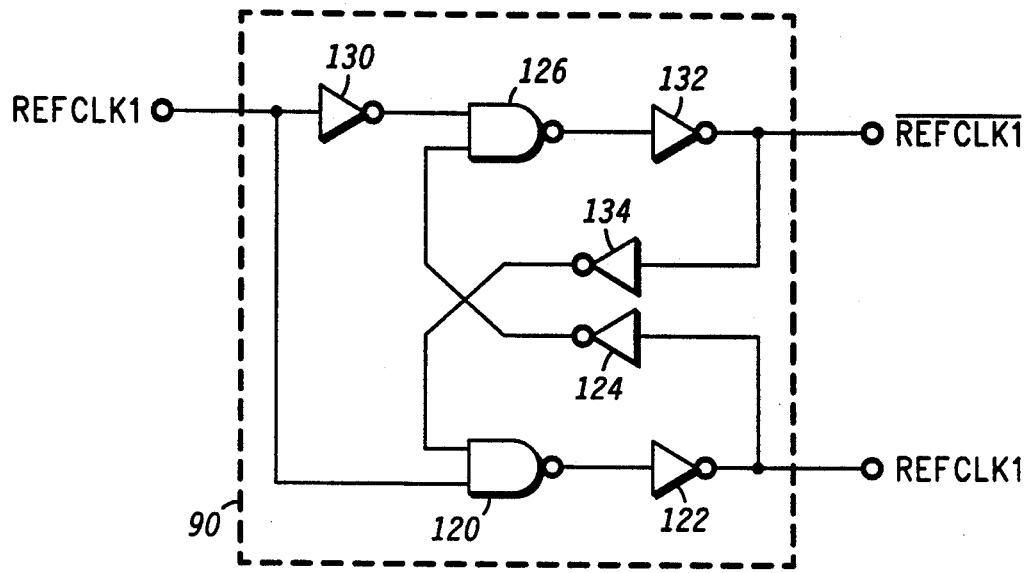
FIG. 5 is a schematic diagram illustrating the non-overlapping clock generator of FIG. 4.

The clock signals REFCLK1 and $\overline{\text{REFCLK1}}$ from non-overlapping clock generator 90 are shown in FIG. 5 including NAND gate 120 having a first input coupled for receiving the REFCLK1 input clock signal and an output coupled through inverter 122 for providing the in-phase REFCLK1 clock signal. The output of inverter 122 is also coupled through inverter 124 to the first input of NAND gate 126, while the second input of the same receives the REFCLK1 input clock signal complemented by inverter 130. The output signal of NAND gate 126 drives inverter 132 for providing the complemented $\overline{\text{REFCLK1}}$ clock signal which is also applied through inverter 134 to the second input of NAND gate 120.

When the REFCLK1 input clock signal is logic one, the in-phase REFCLK1 clock signal is also logic one which produces logic zeroes at the first and second inputs of NAND gate 126. The output of NAND gate 126 is logic one and the $\overline{\text{REFCLK1}}$ clock signal is logic zero. The first and second inputs of NAND gate 120 are thus logic one and its output is logic zero leaving the in-phase REFCLK1 clock signal at logic one as per the initial condition.

As the REFCLK1 input clock signal falls to a logic zero, the output of NAND gate 120 becomes logic one forcing the in-phase REFCLK1 clock signal to transition to logic zero. The logic zero REFCLK1 input clock signal produces a logic one at the second input of NAND gate 126. However, the output of NAND gate 126 cannot change to logic zero until the in-phase REFCLK1 clock signal switches to logic zero. Hence, the $\overline{\text{REFCLK1}}$ clock signal remains logic zero until in-phase REFCLK1 clock signal becomes logic zero since the latter provides the second logic one at the first input of NAND gate 126 necessary to switch the $\overline{\text{REFCLK1}}$ clock signal to logic one.

The non-overlapping period is determined by the delay through inverters 124 and 134 and may be adjusted by sizing the transistors thereof. A similar logic operation is provided on the opposite edge wherein the in-phase REFCLK1 clock signal cannot transition to logic one until the $\overline{\text{REFCLK1}}$ clock signal has changed to logic zero. Thus, the REFCLK1 and $\overline{\text{REFCLK1}}$ clock signals are complementary and non-overlapping such that logic ones never appear simultaneously. Non-overlapping clock generator 92 is constructed in a similar manner as described for non-overlapping clock generator 90.

Figure 6:
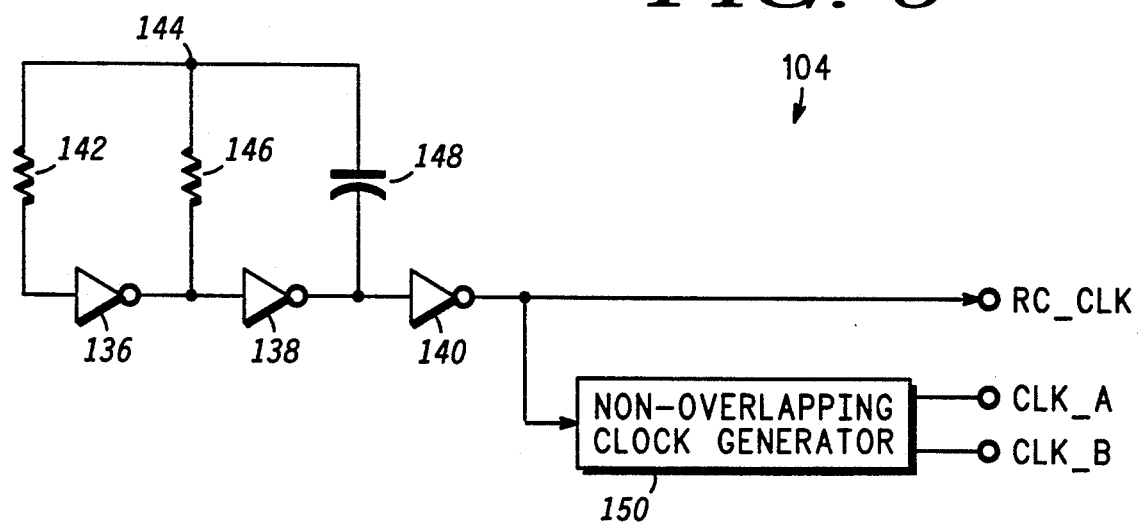
FIG. 6 is a schematic diagram illustrating the RC oscillator circuit of FIG. 4.

RC oscillator 104 is shown in FIG. 6 including serially coupled inverters 136, 138 and 140. Resistor 142 is coupled between input of inverter 136 and node 144, and resistor 146 is coupled between the input of inverter 138 and node 144, while capacitor 148 is coupled between the input of inverter 140 and node 144. Inverters 136-140 in combination with resistors 142 and 146 and capacitor 148 form a monostable multi-vibrator for generating the RC_CLK clock signal at the output of inverter 140 operating at 500 KHz ±20%, depending on the tolerances and temperature coefficients of resistors 142 and 146 and capacitor 148. The RC_CLK clock signal is applied at the input of non-overlapping clock generator 150 for providing the CLK_A and CLK_B signals in a manner as described for non-overlapping clock generator 90 in FIG. 5.

Figure 7:
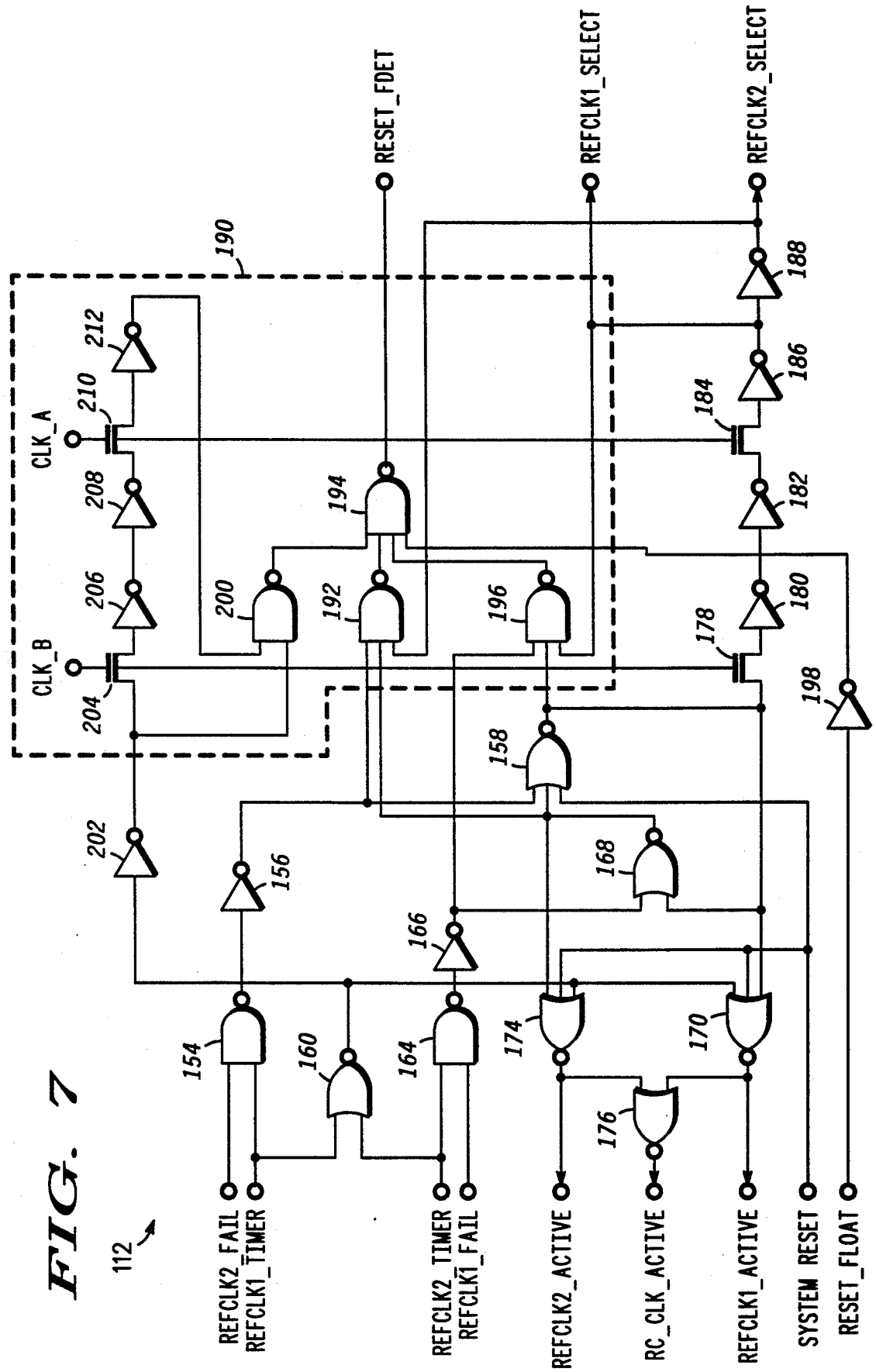
FIG. 7 is a schematic and block diagram illustrating the valid clock selector of FIG. 4.

Referring to FIG. 7, clock selector 112 includes NAND gate 154 having first and second inputs coupled for receiving REFCLK2_FAIL signal and the REFCLK1_TIMER signal. The output of NAND gate 154 is coupled through inverter 156 to the first input of NOR gate 158. The REFCLK1_TIMER signal is also applied to the first input of NOR gate 160, while the second input of the same is coupled for receiving the REFCLK2_TIMER signal. NAND gate 164 receives the REFCLK1_FAIL signal and the REFCLK2_TIMER signal and provides an output signal through inverter 166 to the first input of NOR gate 168. The second and third inputs of NOR gate 158 receive the output signal of NOR gate 168 and the SYSTEM RESET signal. The output of NOR gate 158 is coupled to the second input of NOR gate 168 and to the first input of NOR gate 170. The output of NOR gate 168 is coupled to the first input of NOR gate 174, while the output of NOR gate 160 is coupled to the second inputs of NOR gates 170 and 174. The third inputs of NOR gates 170 and 174 each receive the SYSTEM RESET signal. The output of NOR gate 170 provides the REFCLK1_ACTIVE signal, and the output of NOR gate 174 provides the REFCLK2_ACTIVE signal. The REFCLK1_ACTIVE signal and the REFCLK2_ACTIVE signal are applied at the first and second inputs of NOR gate 176 for providing the RC_CLK_ACTIVE signal at the output thereof.

The output of NOR gate 158 is also coupled to the drain of transistor 178 which includes a gate coupled for receiving the CLK_B signal and a source coupled through inverters 180 and 182 to the drain of transistor 184. The gate of transistor 184 is coupled for receiving the CLK_A signal and the source of the same is coupled through inverter 186 for providing the REFCLK1_SELECT signal and again through inverter 188 for providing the REFCLK2_SELECT signal.

Clock selector 112 also includes a clock status circuit 190 for generating a RESET_FDET signal which removes the true lock status from lock detector and float circuit 38 upon detecting a switch between the REFCLK1, REFCLK2 and RC_CLK clock signals. NAND gate 192 receives signals from the output of inverter 156, the output of NOR gate 168 and the REFCLK2_SELECT signal. The output of NAND gate 192 is applied at the first input of NAND gate 194. NAND gate 196 receives signals from the output of inverter 166, the output of NOR gate 158 and the REFCLK1_SELECT signal and provides an output signal to the second input of NAND gate 194. A third input of NAND gate 194 receives a RESET_FLOAT signal from lock detector and float circuit 38 inverted by inverter 198, while the fourth input of NAND gate 194 receives the output signal of NAND gate 200. Inverter 202 has an input coupled to the output of NOR gate 160 and an output coupled to the first input of NAND gate 200 and to the drain of transistor 204. The gate of transistor 204 is coupled for receiving the CLK_B signal while its source is coupled through inverters 206 and 208 to the drain of transistor 210. The gate of transistor 210 is coupled for receiving the CLK_A signal while its source is coupled through inverter 212 to the second input of NAND gate 200. The output signal of NAND gate 194 is the RESET_FDET signal.

Figure 8:
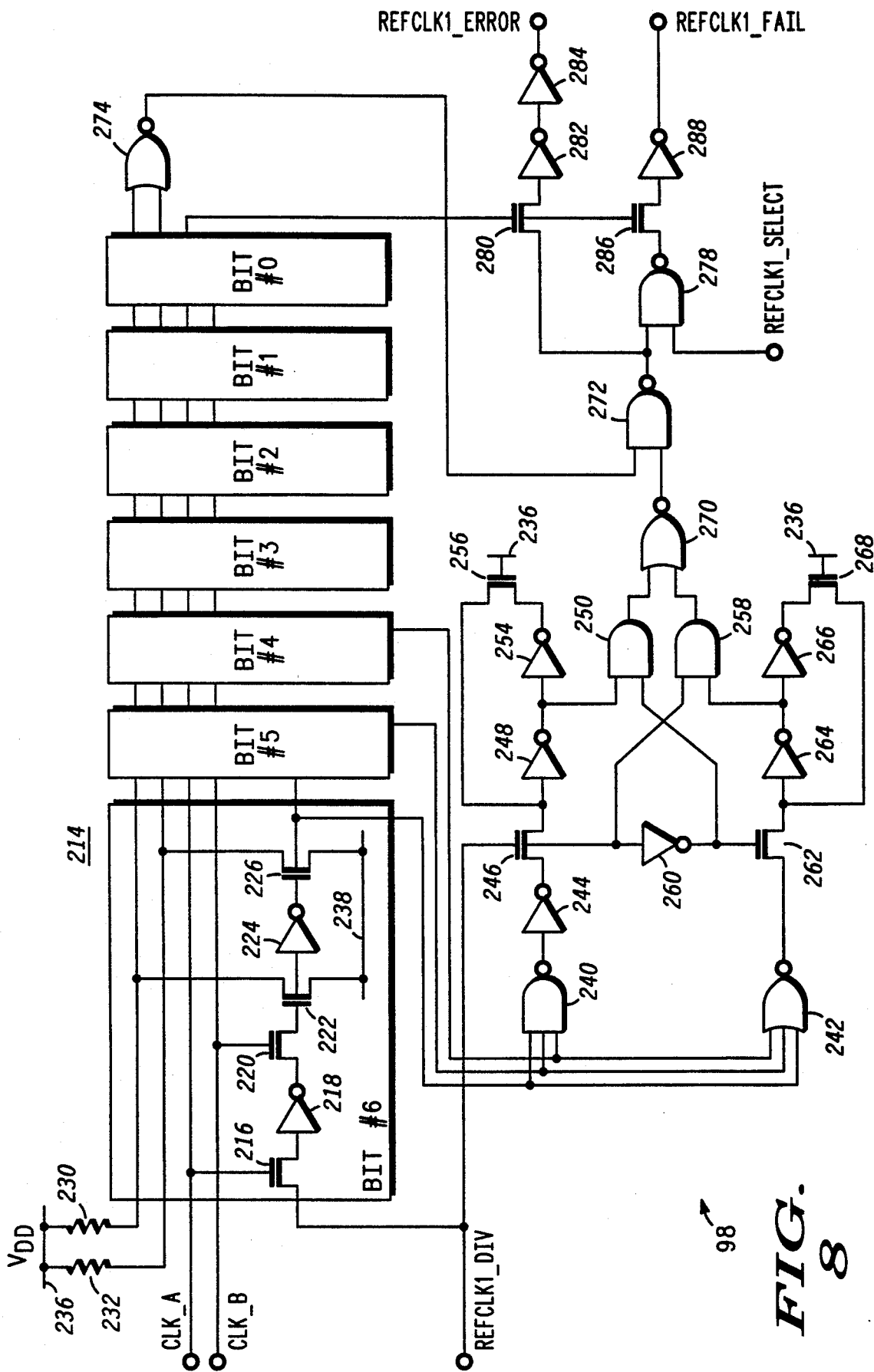
FIG. 8 is a schematic diagram illustrating the clock detector of FIG. 4.

Turning to FIG. 8, valid REFCLK1 detector 98 is shown in further detail including 7-bit shift register 214 coupled for receiving the CLK_A and CLK_B signals. The most significant bit of shift register 214 is shown for illustration including transistor 216 having a drain coupled for receiving the REFCLK1_DIV signal. The gate of transistor 216 receives the CLK_A signal while its source is coupled through inverter 218 to the drain of transistor 220 which includes a gate coupled for receiving the CLK_B signal and a source coupled to the gate of transistor 222 and through inverter 224 to the gate of transistor 226. The drains of transistors 222 and 226 are coupled through resistors 230 and 232, respectively, to power supply conductor 236 operating at a positive potential such as VDD. The sources of transistors 222 and 226 are coupled to power supply conductor 238 operating at ground potential.

The most significant bit of shift register 214 is provided at the output of inverter 224. Bit 0, bit 1, bit 2, bit 3, bit 4 and bit 5 of shift register 214 follow a similar construction as described for bit 6. The outputs of bit 6, bit 5 and bit 4 of shift register 214 are coupled to the inputs of NAND gate 240 and to the inputs of NOR gate 242. The output of NAND gate 240 is coupled through inverter 244 to the drain of transistor 246, the latter of which includes a gate coupled for receiving the REFCLK1_DIV signal and a source coupled through inverter 248 to the first input of AND gate 250. The output of inverter 248 is also coupled through inverter 254 and through the drain-to-source conduction path of transistor 256 back to the input of inverter 248. The gate of transistor 246 is coupled to the first input of AND gate 258 and through inverter 260 to the second input of AND gate 250 and to the gate of transistor 262. The output of NOR gate 242 is coupled to the drain of transistor 262 while its source is coupled through inverter 264 to the second input of AND gate 258. The output of inverter 264 is coupled through inverter 266 and through the drain-to-source conduction path of transistor 268 back to the input of inverter 264. The gates of transistors 256 and 268 are coupled for receiving a high signal from power supply conductor 236. The outputs of AND gates 250 and 258 are coupled to the first and second inputs of NOR gate 270, the output of which is applied at the first input of NAND gate 272.

The first and second inputs of NOR gate 274 are coupled to the drains of transistors like 222 and 226, respectively, of each of bits 0-6 of shift register 214. NOR gate 274 issues a logic zero if bits 0-6 of shift register 214 fill with all logic zeroes, or all logic ones, indicating a stuck-at-zero, or stuck-at-one, condition for the REFCLK1_DIV signal. The output of NOR gate 274 is coupled to the second input of NAND gate 272, and the output of NAND gate 272 is coupled to the input of NAND gate 278 and to the drain of transistor 280 which includes a gate coupled for receiving the CLK_A signal and a source coupled through inverters 282 and 284 for providing the REFCLK1_ERROR signal. The second input of NAND gate 278 receives the REFCLK1_SELECT signal from clock selector 112 and provides the REFCLK1_FAIL signal through transistor 286 and inverter 288. The gate of transistor 286 also receives the CLK_A signal. Valid REFCLK2 detector 102 includes similar components as described for valid REFCLK1 detector 98 for monitoring the REFCLK2 clock signal.

In relating the flow chart of FIGS. 2 and 3 to the schematic and block diagrams of FIGS. 1 and 4-10, first consider a power-on reset operation initiated by asserting the SYSTEM RESET signal. Turning to FIG. 7, the REFCLK1_TIMER signal and REFCLK2_TIMER signal are initially logic one while the REFCLK1_FAIL signal and REFCLK2_FAIL signal are logic zero for a logic one at the output of NOR gate 160. The outputs of NAND gates 154 and 164 are logic one producing a logic one at the output of NOR gate 168. The outputs of NOR gates 158, 170 and 174 become logic zero with a logic one SYSTEM RESET signal. The REFCLK1_ACTIVE signal and the REFCLK2_ACTIVE signal are both false logic zero, producing a true RC_CLK_ACTIVE signal at the output of NOR gate 176. With the RC_CLK_ACTIVE signal asserted and the REFCLK1_ACTIVE and REFCLK2_ACTIVE signals low, multiplexer 12 of FIG. 1 passes the 500 KHz RC_CLK input clock signal as REFCLK through to phase detector 16 allowing PLL 10 to train thereto. The voltage at loop node 20 moves to a nominal value close to that needed for the REFCLK1 and REFCLK2 clock signals. The RC_CLK_ACTIVE signal also controls multiplexer 32 to select the VCO oscillator signal divided by M=48 such that OSCOUT may operate near the 500 KHz REFCLK from the RC_CLK clock signal.

Proceeding to step 54 of FIG. 2, the SYSTEM RESET signal is deactivated to logic zero although the logic one at the output of NOR gate 168 maintains the logic zero state of NOR gate 158 which passes through transistor 178, inverters 180 and 182, and transistor 184 during one period of the RC_CLK clock signal under control of the CLK_A and CLK_B signals. The output of inverter 186 remains high for a true REFCLK1_SELECT signal while the REFCLK2_SELECT signal is false at logic zero. NOR gate 170 receives all logic zeroes producing a true logic one for the REFCLK1_ACTIVE signal and a logic zero for the RC_CLK_ACTIVE signal. The REFCLK2_ACTIVE signal remains at logic zero because of the logic one at the output of NOR gate 168. Thus, the default state for redundant clock selector 14 is to activate the REFCLK1 clock signal through multiplexer 12 and allow PLL 10 to lock thereto.

As for clock status circuit 190, NAND gate 192 receives logic zeroes from the output of inverter 156 and the REFCLK2_SELECT signal, and a logic one from the output of NOR gate 168. Likewise, NAND gate 196 receives logic zeroes from the output of inverter 166 and the output of NOR gate 158, and a logic one from the REFCLK1_SELECT signal, while NAND gate 200 receives a logic one from the output of inverter 202 and a logic zero from the output of inverter 212. The RESET_FLOAT signal is logic zero and the output of inverter 198 is logic one. All four inputs of NAND gate 194 are thus logic one and the RESET_FDET signal is logic zero.

Redundant clock selector 14 begins to monitor the health of the REFCLK1 and REFCLK2 clock signals. The REFCLK1 clock signal is split into in-phase and complementary clock phases by non-overlapping clock generator 90 of FIG. 4 and further frequency divided by circuit 94 producing the REFCLK1_DIV signal operating at 64 KHz with a 50% duty cycle. Likewise, the REFCLK2 clock signal is split into in-phase and complementary clock phases by non-overlapping clock generator 92 and further frequency divided by circuit 100 producing the REFCLK2_DIV signal applied to valid REFCLK2 detector 102.

Returning to FIG. 8, the REFCLK1_DIV signal is clocked into bit 6 of shift register 214 by the CLK_A and CLK_B signals from RC oscillator 104. The first high state of the CLK_A signal enables transistor 216 passing the logic one REFCLK1_DIV signal where it is inverted and passed through transistor 220 during the subsequent first high state of the CLK_B signal. Transistor 222 is turned off by the low signal at its gate while transistor 226 is turned on by inverter 224. The drain of transistor 226 pulls the second input of NOR gate 274 to logic zero at power supply conductor 238. With REFCLK1_DIV operating at 64 KHz (7.8 microseconds in the high state) and the CLK_A and CLK_B signals operating at the low end of 500 KHz—20% (2.5 microsecond period), shift register 214 clocks in at least three logic ones worst case into the most significant bits thereof during the high state of the REFCLK1_DIV signal. Bit 5 and bit 4 of shift register 214 behave in a similar manner as described for bit 6 such that at the end of three periods of the RC_CLK clock signal, logic ones appear at the inputs of NAND gate 240.

Assuming the REFCLK1 clock signal is valid, operating at the desired 4.096 MHz, bits 0-3 of shift register 214 contain logic zeroes at the outputs of inverters like 224 from the previous low period of the REFCLK1_DIV signal. Transistors like 222 of bits 0-3 are conducting, pulling the first input of NOR gate 274 to logic zero. Thus, between bits 0-6 of shift register 214, the first and second inputs of NOR gate 274 are both logic zero and its output is logic one indicating no stuck-at-zero or stuck-at-one faults.

When the REFCLK1_DIV signal is high, the logic zero at the output of inverter 260 holds off the logic state of inverter 248 allowing time for bits 4-6 to fill-up. Logic ones shift into bit 6, bit 5 and bit 4 during three cycles of the CLK_A and CLK_B signals and drive the output of NAND gate 240 to logic zero and the output of inverter 244 to logic one. The high state of the REFCLK1_DIV signal enables transistor 246 while providing a logic one at the first input of AND gate 258. The first input of AND gate 250 receives the logic zero at the output of inverter 248, and the second input of the same receives a logic zero from the output of inverter 260, thereby developing a logic zero at the first input of NOR gate 270. Transistor 262 is disabled by the logic zero at the output of inverter 260. However, the previous valid low state of the REFCLK1 clock signal had established a logic zero at the output of inverter 264 which is locked in place by feedback transistor 268. The logic one and logic zero at the inputs of AND gate 258, in combination with the logic zero at the output of AND gate 250, produce a logic one at the first input of NAND gate 272 and a logic zero at the first input of NAND gate 278. The REFCLK1_SELECT signal is initially a true logic one following the SYSTEM RESET signal as previously described, producing a logic one at the output of NAND gate 278. The next high state of the CLK_A signal passes the logic zero at the output of NAND gate 272 through transistor 280 and the logic one at the output of NAND gate 278 through transistor 286, yielding logic zeroes for the REFCLK1_ERROR signal and the REFCLK1_FAIL signal and indicating a valid REFCLK1 clock signal. REFCLK1 timer 108 inverts the REFCLK1_ERROR signal for providing a logic one REFCLK1_TIMER signal at the second input of NAND gate 154 of FIG. 7.

As the REFCLK1_DIV signal transitions to logic zero, the signal path through transistor 246 is disabled whereby feedback transistor 256 latches the logic one state of inverter 244 at the input of inverter 248 and its complement at the first input of AND gate 250. The output of inverter 260 becomes logic one although the output of AND gate 250 remains logic zero because the logic zero state of inverter 248. Thus, the validity of the high state of the REFCLK1_DIV signal is checked at the zero-going transition thereof so that intermediate logic states of inverter 248 are ignored until bits 4-6 of shift register 214 contain the desired data.

Bits 4-6 of shift register 214 begin to fill with logic zeroes from the REFCLK1_DIV signal, although the logic zero at the second input of AND gate 258 holds off the logic states of inverter 264 allowing time for bits 4-6 to fill-up. Following three more CLK_A and CLK_B cycles, logic zeroes appear at the outputs of bit 6, bit 5 and bit 4 and drive the output of NOR gate 242 to logic one. The low state of the REFCLK1_DIV signal enables transistor 262 for providing a logic zero at the output of inverter 264, while the first input of AND gate 258 receives a logic zero from the REFCLK1_DIV signal, thereby developing a logic zero at the second input of NOR gate 270. Recall that the previous valid high state of the REFCLK1 clock signal established a logic zero at the output of inverter 248 which is locked in place by feedback transistor 256 since transistor 246 is disabled. The logic zeroes at the outputs of AND gates 250 and 258 produce a logic one at the first input of NAND gate 272 and a logic zero at the first input of NAND gate 278. The next high state of the CLK_A signal passes the logic zero at the output of NAND gate 272 through transistor 280 and the logic one at the output of NAND gate 278 through transistor 286, yielding logic zeroes for the REFCLK1_ERROR signal and the REFCLK1_FAIL signal and again indicating a valid REFCLK1 clock signal.

As the REFCLK1_DIV signal transitions to logic one, the signal path through transistor 262 is disabled whereby feedback transistor 268 latches the logic one state of NOR gate 242 at the input of inverter 264 and its complement at the second input of AND gate 258. The first input of AND gate 258 becomes logic one although its output remains logic zero because the logic zero state of inverter 264. Hence, the validity of the low state of the REFCLK1_DIV signal is checked at the positive-going transition thereof.

A similar process occurs simultaneously in valid REFCLK2 detector 102. As long as shift register like 214 in valid REFCLK2 detector 102 clocks in at least three logic ones followed by at least three logic zeroes from the REFCLK2_DIV signal, the output signal of NAND gate like 272 stays at logic zero. However, with the REFCLK2_SELECT signal at logic zero, the output of NAND gate 278 remains at logic one preventing the REFCLK2_FAIL signal from attempting to switch clocks if an error occurred with the unused REFCLK2 clock signal.

Thus, for normal operation, the REFCLK1 clock signal (or REFCLK2 clock signal) drives PLL 10 and generates a logic one DETECT signal indicating the loop is locked. A complete discussion of the DETECT signal is provided in the related aforementioned patent application entitled "LOCK DETECTION FOR A PHASE LOCK LOOP". Briefly, the DETECT signal remains high as long as the phase difference between the REFCLK signal and the OSCOUT signal is within the TIMESLOT window.

Figure 9:
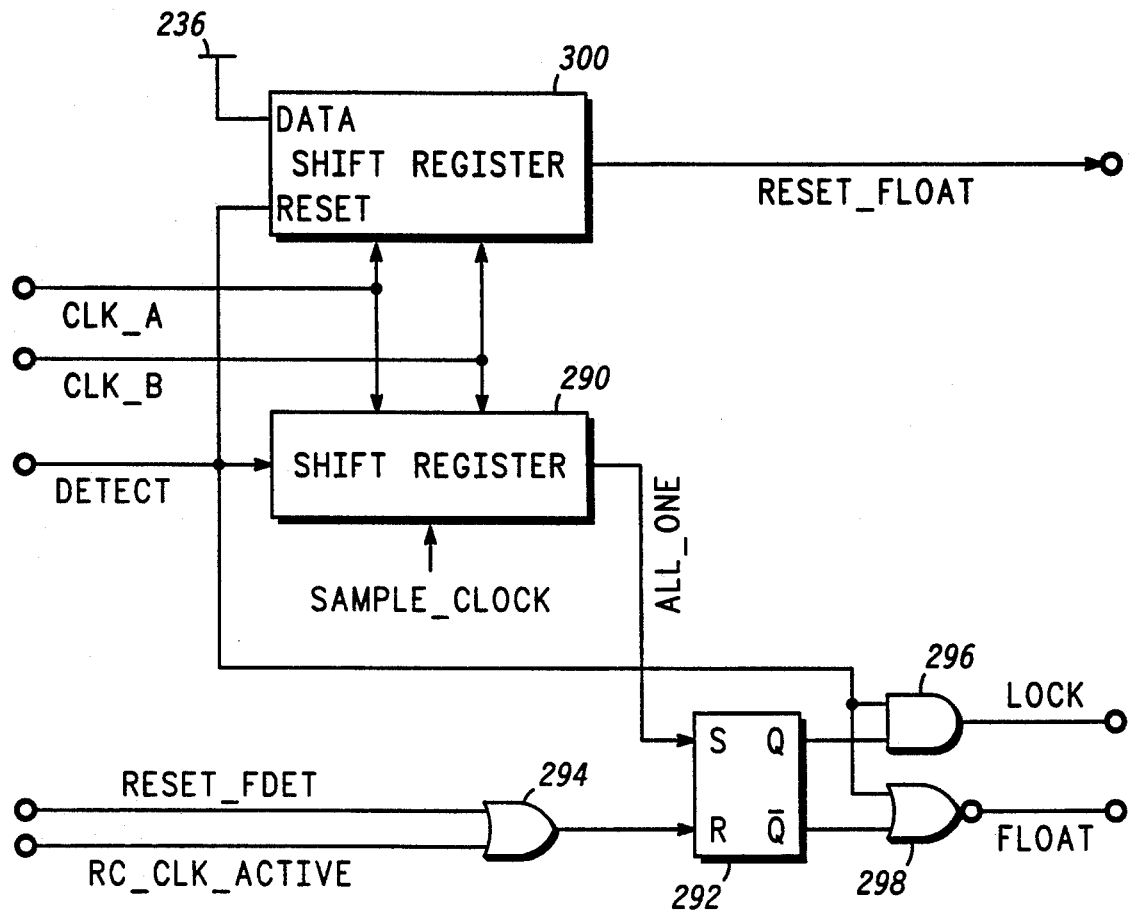
FIG. 9 is a schematic and block diagram illustrating the lock detector and float circuit of FIG. 1.

The DETECT signal is applied to lock detector and float circuit 38 shown in FIG. 9. Shift register 290 receives the DETECT signal and the SAMPLE_CLOCK signal from divide-by-N circuit 30 for providing a high ALL_ONE signal after shifting in seven logic one DETECT signals. Such is the case when operating in phase lock. The ALL_ONE signal is applied at the set input of flipflop 292, while the reset input of the same is coupled to the output of OR gate 294 which is responsive to the RESET_FDET signal and the RC_CLK_ACTIVE signal applied at first and second inputs thereof. The Q-output of flipflop 292 is coupled to the first input of AND gate 296, while its Q-output is coupled to the first input of NOR gate 298. The Q-output of flipflop 292 is logic one for normal operating condition after the ALL_ONE signal has switched to logic one. The output of AND gate 296 provides the LOCK signal, and the output of NOR gate 298 provides the FLOAT signal. Either the RESET_FDET signal or the RC_CLK_ACTIVE signal can reset flipflop 292, thereby setting the LOCK signal and the FLOAT signal to logic zeroes.

Lock detector and float circuit 38 also includes 7-bit shift register 300 for detecting any phase shift in the REFCLK clock signal after momentary glitches. Shift registers 290 and 300 follow a similar construction as described for shift register 214 of FIG. 8. The DETECT signal is applied at the reset input of shift register 300, while its data input is coupled for receiving a logic one from power supply conductor 236. A logic one DETECT signal resets shift register 300 to all zeroes. When the DETECT signal is logic zero, the CLK_A and CLK_B signals shift logic ones through shift register 300 until appearing at its output as the RESET_FLOAT signal which is applied though inverter 198 to the the fourth input of NAND gate 194 of FIG. 7. Thus, should the DETECT signal drop low from a glitch of the REFCLK1 clock, shift register 300 begins clocking in logic ones. If the REFCLK1 clock signal returns to normal operation in-phase with the OSCOUT signal, the DETECT signal returns to logic one and resets shift register 300 effectively stopping the count. However, if the REFCLK1 returns to normal operation, but out-of-phase with the OSCOUT signal, the RESET_FLOAT signal becomes logic one in seven periods of the CLK_A and CLK_B signals, forcing the RESET_F-DET signal to logic one, resetting the $\overline{Q}$-output of flip-flop 292 for a logic zero FLOAT signal. This allows charge pump 18 to adjust loop node 20 and re-achieve phase lock for PLL 10.

The second inputs of AND gates 296 and 298 receive the DETECT signal for providing the quick recovery feature in accordance with steps 62-64 of FIG. 2. When there is a problem with the REFCLK1 clock signal, the DETECT signal immediately becomes logic zero because the phase difference between the REFCLK and OSCOUT signals extends beyond the TIMESLOT window, thereby forcing the LOCK signal to logic zero and the FLOAT signal to logic one. The FLOAT signal is applied to charge pump 18 to disable the charging and discharging of loop node 20.

Figure 10:
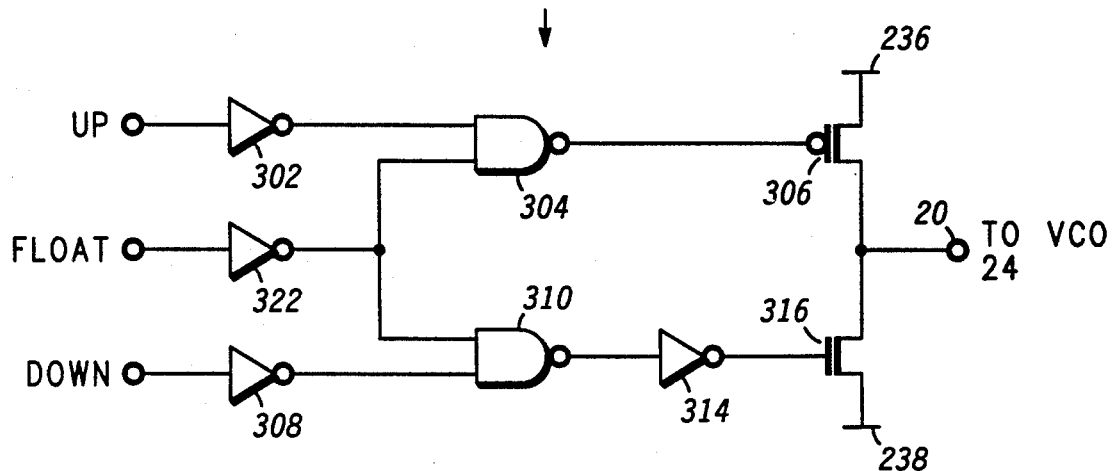
FIG. 10 is a schematic diagram illustrating the charge pump circuit of FIG. 1.

An example of charge pump 18 is shown in FIG. 10 including inverter 302 having an input coupled for receiving the UP control signal and an output coupled to the first input of NAND gate 304. The output signal of NAND gate 304 is applied at the gate of transistor 306 which includes a source coupled to power supply conductor 236 and a drain coupled to loop node 20 for charging loop filter 22. The DOWN control signal from phase detector 16 is applied through inverter 308 to the first input of NAND gate 310. The output of NAND gate 310 is complemented by inverter 314 and applied at the gate of transistor 316. The source of transistor 316 is coupled to power supply conductor 238 and the drain of transistor 316 is coupled to loop node 20 for discharging loop filter 22. The FLOAT control signal is applied through inverter 322 to the second inputs of NAND gates 304 and 310.

When the FLOAT signal is logic one, the UP control signal and DOWN control signal are disabled since the outputs of NAND gates 304 and 310 remain at logic one, thereby disabling transistors 306 and 316. Thus, the FLOAT control signal inhibits the UP control signal and DOWN control signal from altering the voltage on loop node 20 such that it floats. Alternately, a logic zero FLOAT signal allows the logic states of the UP control signal and the DOWN control signal to pass through NAND gates 304 and 310, enabling transistors 306 and 316 accordingly to charge and discharge loop node 20.

Returning to FIG. 2, consider the case where the REFCLK1 clock signal skips a beat causing CHECK REFCLK1 step 60 to fail, although the clock immediately recovers. The phase difference between the REFCLK and OSCOUT signals extends beyond the TIMESLOT window for a brief period long enough for the DETECT signal to drop low, thereby triggering FLOAT VCO step 62 and REFCLK1 QUICK RECOVERY step 64. The logic zero DETECT signal at the second inputs of AND gate 296 and NOR gate 298 forces the LOCK signal low and the FLOAT signal to logic one, floating loop node 20 to hold it steady. The DETECT signal also removes reset from shift register 300 beginning its counting sequence. If the REFCLK1 clock signal comes back in-phase, the DETECT signal returns to logic one, resetting shift register 300 and keeping the RESET_FLOAT signal disabled at logic zero. The LOCK signal returns to logic one and the FLOAT signal is removed allowing PLL 10 to continuing operating where it left off, as per the quick recovery procedure in steps 62-66 of FIG. 2.

Alternately, if the REFCLK1 clock signal recovers out-of-phase, the DETECT signal remains logic zero since charge pump circuit 18 is disabled, whereby the phase difference between the REFCLK and OSCOUT signal continues to extend beyond the TIMESLOT window. After seven periods of the RC_CLK signal, a logic one RESET_FLOAT signal appears at the output of shift register 300 where it is complemented to a logic zero by inverter 198 of FIG. 7. The output of NAND gate 194 becomes logic one, returning through OR gate 294 of FIG. 9 and producing a logic one at the reset input of flipflop 292. The Q-output of flipflop 292 resets to logic zero and the $\overline{Q}$-output to logic one, forcing both the LOCK signal and the FLOAT signal to false logic zeroes. This allows charge pump 18 adjust VCO 24 to the new phase of the REFCLK1 signal as per steps 66 and 56 of FIG. 2.

When phase detector 16 corrects the phase difference between the REFCLK signal and the OSCOUT signal within the TIMESLOT window, the DETECT signal becomes logic one again. Once seven logic ones have clocked into shift register 290 via the SAMPLE_CLOCK signal, the ALL_ONE signal switches to logic one, setting the Q-output and $\overline{Q}$-output of flipflop 292 to logic one and logic zero, respectively. The LOCK signal is a true logic one again, while the FLOAT signal remains a false logic zero. CHECK REFCLK1 step 60 continues monitoring the REFCLK1 clock signal.

Now consider the case where the frequency of the REFCLK1 clock signal drifts too high such that CHECK REFCLK1 step 60 fails again. The momentary glitch of the previous failure example would not induce a switch between the redundant clock signals REFCLK1 and REFCLK2 since the lower frequency (64 KHz) REFCLK1_DIV signal requires a longer period of continuous failure than aforedescribed. In the present example, the higher frequency of the invalid REFCLK1 clock signal extends the phase difference between the REFCLK and OSCOUT signals beyond the TIMESLOT window, causing the DETECT signal to drop low. PLL 10 attempts the quick recovery procedure in step 62-66 described above; however, since the FLOAT signal has disabled charge pump 18, VCO 24 cannot adjust to the higher frequency whereby the DETECT signal remains logic zero.

The REFCLK1_DIV signal follows the higher frequency of the invalid REFCLK1 clock signal such that only two logic ones shift into bits 5 and 6 of shift register 214 during the high state of the REFCLK1_DIV signal before it transitions back to logic zero. The "110" pattern from bits 6, 5 and 4, respectively, at the inputs of NAND gate 240 produces a logic one at the input of inverter 244 and a logic one at the output of inverter 248 where it is latched by transistor 256 when the REFCLK1_DIV signal switches low. The REFCLK1_DIV signal is logic zero, turning off transistor 246 and turning on transistor 262 via inverter 260. The logic one at the output of inverter 260, in combination with the logic one at the output of inverter 248 produces a logic one at the output of AND gate 250 and a logic zero at the output of NOR gate 270. The output of NAND gate 272 goes high and the output of NAND gate 278 becomes logic zero. The REFCLK1_ERROR and REFCLK1_FAIL signals both switch to logic one indicating an invalid REFCLK1 clock signal.

Hence, the invalid clock detecting mechanism of valid REFCLK1 detector 98 (and 102) is based on the premise that the divided frequency of the REFCLK1 clock signal remains at a high state and a low state each for three periods of the RC_CLK clock signal. The frequency of the RC_CLK signal must be selected accordingly with that of the REFCLK1 and REFCLK2 clock signals.

REFCLK1 timer 108 immediately changes state to logic zero for the REFCLK1_TIMER signal and holds that state for at least seven cycles of the RC_CLK clock signal. REFCLK1 timer 108 includes a shift register (not shown) similar to shift register 300, wherein the input signal must be logic zero for seven clock cycles before the output changes back to logic one. Any subsequent logic one failure states of the REFCLK1_FAIL signal resets the logic one output state of REFCLK1 timer 108 and starts the seven clock count again. A momentary glitch of the REFCLK1 clock signal would most likely not be detected by this logic since the 4 MHz base clock signal is divided down 64 times to the REFCLK1_DIV signal. If the failure of the REFCLK1 clock signal recovers and the REFCLK1_FAIL signal reverts to logic zero and stays there, the REFCLK1_TIMER signal returns to logic one indicating the REFCLK1 clock signal is again valid. Otherwise, if the REFCLK1 clock signal continues to malfunction, the REFCLK1_TIMER signal maintains its logic zero state. Therefore, the REFCLK1_TIMER and the REFCLK2_TIMER are recent history status indicators that the respective input clock signals have been valid for at least seven periods of the RC_CLK clock signal.

The logic one REFCLK1_FAIL signal changes the output state of NAND gate 164 to logic zero and the output state of inverter 166 to logic one. This occurs only if the output state of the REFCLK2_TIMER signal is logic one, verifying the REFCLK2 clock signal has been valid for at least seven RC_CLK cycles and, therefore, is in condition to take over. The process of checking the REFCLK2 clock signal within valid REFCLK2 detector 102 and issuing true REFCLK2_FAIL and REFCLK2_ERROR signals follows step 70 of FIG. 3. The output of NOR gate 168 switches to logic zero producing a logic one at the output of NOR gate 158. NOR gate 174 thus receives all logic zeroes changing the REFCLK2_ACTIVE signal to logic one, while NOR gate 170 receives a logic one from the output of NOR gate 158, disabling the REFCLK1_ACTIVE signal. Multiplexor 12 switches to the REFCLK2 clock signal as per step 72 of FIG. 3. Furthermore, the logic one at the output of NOR gate 158 passes through transistor 178, inverters 180 and 182, and transistor 184 during one cycle of the CLK_A and CLK_B signals. The output of inverter 186 switches to a logic zero for a false REFCLK1_SELECT signal, while the REFCLK2_SELECT signal is a true logic one.

As noted above, all four inputs of NAND gate 194 are logic one and the RESET_FDET signal is logic zero for normal operation. Once detecting an invalid REFCLK1 clock signal, it is necessary to remove the lock status and force PLL 10 to re-lock to the REFCLK2 clock signal. The output of inverter 166 becomes logic one with the REFCLK1_FAIL signal which combines with the logic one at the output of NOR gate 158 and a logic one from the REFCLK1_SELECT signal before the latter changes state. The logic zero at the output of NAND gate 196 produces a logic one RESET_FDET signal to reset flip-flop 292 of FIG. 9 and remove the LOCK signal. PLL 10 achieves phase lock to the REFCLK2 clock signal.

Another failure scenario involves a low frequency REFCLK1 clock signal, wherein the high state, or low state, of the REFCLK1 clock signal is greater than seven periods of the RC_CLK signal. The REFCLK1 clock signal may even be stuck-at-one or stuck-at-zero (DC). For a stuck-at-one fault, the logic ones from the REFCLK1_DIV signal continues to shift into bits 0–6 of shift register 214 in FIG. 8 since there is not a zero-going transition. Transistors like 226 of bits 0–6 pull the second input of NOR gate 274 to logic zero. The first input of NOR gate 274 is pulled high through resistor 232 since transistors like 222 are each turned off. The output of NOR gate 274 becomes logic zero forcing logic ones at the outputs of NAND gates 272 and zero at the output of NAND gate 278 and again presenting logic one REFCLK1_ERROR and REFCLK1_FAIL signals to clock selector 112. The failure is processed as described above resulting in a switch to the REFCLK2 clock signal. A stuck-at-zero REFCLK1_DIV signal would produce the same logic zero at the output of NOR gate 274 by pulling the first input thereof to logic zero through transistors like 222, while its second input is pulled high via resistor 232. The resolution of low-frequency detection may by adjusted by increasing or decreasing the width of shift register 214.

A technician can be notified of the problem with the REFCLK1 clock signal by a front panel failure light (not shown) while PLL 10 continues providing the 24 MHz reference signal with the REFCLK2 clock signal at output 26 without noticeable interruptions. Assuming repairs are made to the REFCLK1 clock signal, the REFCLK1_ERROR signal drops low and the REFCLK1_TIMER signal return to logic one following seven periods of the RC_CLK signal. Further suppose the REFCLK2 clock signal now has problems and drifts too high in frequency such that CHECK REFCLK2 step 76 fails. PLL 10 attempts the quick recovery procedure in step 78–82 described above; however, since the FLOAT signal has disabled charge pump 18, VCO 24 cannot adjust to the higher frequency and the DETECT signal remains logic zero. The REFCLK2_DIV signal follows the higher frequency of the invalid REFCLK2 clock signal and causes the REFCLK2_ERROR and REFCLK2_FAIL signals both switch to logic one indicating an invalid REFCLK2 clock signal as described for the high-frequency REFCLK1 failure.

REFCLK2 timer 110 immediately changes state to logic zero for the REFCLK2_TIMER signal and holds that state for at least seven cycles of the RC_CLK clock signal. The logic one REFCLK2_FAIL signal changes the output state of NAND gate 154 to logic zero and the output state of inverter 156 to logic one. This occurs only if the output state of the REFCLK1_TIMER signal is logic one, verifying the REFCLK1 clock signal has been valid for at least seven RC_CLK cycles and, therefore, is in condition to take over. The output of NOR gate 158 switches to logic zero, producing a logic one at the output of NOR gate 168. NOR gate 170 thus receives all logic zeroes changing the REFCLK1_ACTIVE signal to logic one, while NOR gate 174 receives a logic one from the output of NOR gate 168, disabling the REFCLK2_ACTIVE signal. Multiplexor 12 switches back to the REFCLK1 clock signal accordingly. Furthermore, the logic zero at the output of NOR gate 158 passes through transistor 178, inverters 180 and 182, and transistor 184 during one cycle of the CLK_A and CLK_B signals. The output of inverter 186 switches to a logic one for a true REFCLK1_SELECT signal, while the REFCLK2_SELECT signal is a false logic zero.

Once detecting an invalid REFCLK2 clock signal, it is necessary to remove the lock status and force PLL 10 to relock to the REFCLK1 clock signal. The logic one at the output of inverter 156 combines with the logic one at the output of NOR gate 168 and a logic one from the REFCLK2_SELECT signal before the latter changes state. The logic zero at the output of NAND gate 192 produces a logic one RESET_FDET signal to reset flipflop 292 of FIG. 9 and remove the LOCK signal. PLL 10 re-achieves phase lock to the REFCLK1 clock signal.

For the unlikely situation where both the REFCLK1 and REFCLK2 signals are invalid, the REFCLK1_TIMER and REFCLK2_TIMER signals are both logic zeroes and the output of NOR gate 160 is logic one. The outputs of NOR gates 170 and 174 become logic zero and the RC_CLK_ACTIVE signal is logic one. The RC_CLK clock signal is routed through multiplexer 12 and drives the loop as per step 52 of FIG. 2. The RC_CLK_ACTIVE signal also resets flipflop 292 and removes the LOCK signal and the FLOAT signal allowing PLL 10 to train to the RC_CLK signal.

When one of the input clock signals REFCLK1 and/or REFCLK2 becomes valid again, the output of NOR gate 160 returns to logic zero producing a logic one at the first input of NAND gate 200 which, in combination with the one at the second input of the same, yields a logic zero at the fourth input of NAND gate 194 and a logic one RESET_FDET signal. This again resets flipflop 292 insuring the FLOAT signal is logic zero so that PLL 10 can adjust for the REFCLK1 or REFCLK2 clock signal. The logic zero at the output of NOR gate 160 also activates the REFCLK1_ACTIVE or REFCLK2_ACTIVE signal according to which clock has recovered, whereby PLL 10 returns to normal operation.

Hence, what has been provided is a novel phase lock loop for monitoring the frequency of redundant input clock signals and switching back and forth therebetween should one or the other become invalid, thereby allowing the PLL to continue normal operation even with a failure of one input clock signal. If both the input clock signals fail, an internal oscillator maintains the PLL at a nominal operating frequency until one of the input clock signals is restored whereby the loop can quickly re-establish phase lock.

We claim:

1. A method of selecting between first and second input clock signals applied to a phase lock loop (PLL), comprising the steps of:

checking validity of the first input clock signal by counting pulses of a first reference signal during first and second states of one period of the first input clock signal and locking the PLL to the first input clock signal if valid as indicated by a predetermined number of pulses of said reference signal occurring during said first and second states of said one period of the first input clock signal;

switching to the second input clock signal if the first input clock signal becomes invalid; and checking validity of the second input clock signal by counting pulses of a second reference signal during first and second states of one period of the second input clock signal and locking the PLL to the second input clock signal if valid.

2. The method of claim 1 further comprising the steps of:

applying a reference clock signal to the PLL during system reset for establishing a nominal operating point thereof; and returning control of the PLL to said reference clock signal if both the first and second input clock signals are invalid.

3. A method of selecting between first and second input clock signals applied to a phase lock loop (PLL), comprising the steps of:

checking validity of the first input clock signal and locking the PLL to the first input clock signal if valid;

switching to the second input clock signal if the first input clock signal becomes invalid;

checking the validity of the second input clock signal and locking the PLL to the second input clock signal if valid;

applying a reference clock signal to the PLL during system reset for establishing a nominal operating point thereof;

returning control of the PLL to said reference clock signal if both the first and second input clock signals are invalid;

disabling movement of the PLL upon detecting an invalid state of the first input clock signal;

checking the validity of the first input clock signal during a time period to see if it recovers; and returning control of the PLL to the first input clock signal if it recovers during said time period such that the PLL is still operating at substantially the frequency as before the failure of the first input clock signal.

4. The method of claim 3 further including the steps of enabling movement of the PLL upon detecting a valid first input clock signal operating out-of-phase from before the failure of the first input clock signal.

5. A method of selecting between first and second input clock signals applied to a phase lock loop (PLL), comprising the steps of:

checking validity of the first input clock signal by determining duration of a period of the first input clock signal and locking the PLL to the first input clock signal if valid;

switching to the second input clock signal if the first input clock signal becomes invalid; and checking validity of the second input clock signal by determining duration of a period of the second input clock signal and locking the PLL to the second input clock signal if valid by, (a) disabling movement of the PLL upon detecting an invalid state of the second input clock signal, (b) checking the validity of the second input clock signal during a time period to see if it recovers, and (c) returning control of the PLL to the second input clock signal if it recovers during said time period such that the PLL is still operating at substantially the frequency as before the failure of the second input clock signal.

6. The method of claim 5 wherein said step of checking the validity of a second input clock signal further includes the steps of enabling movement of the PLL upon detecting a valid first input clock signal operating out-of-phase from before the failure of the first input clock signal.

7. A phase lock loop (PLL) responsive to a first digital signal for generating a second digital signal operating substantially at frequency and in-phase with said first digital signal, said phase lock loop comprising:

first means responsive to first and second control signals for selecting between first and second input clock signals respectively applied at first and second inputs thereof for providing the first digital signal of the PLL at an output; and second means for monitoring validity of said first and second input clock signals by determining duration of a period of the first input clock signal and by determining duration of a period of the second input clock signal, said second means activating said first control signal when the first input clock signal is valid and activating said second control signal when the first input clock signal is invalid.

8. The phase lock loop of claim 7 wherein said second means includes an oscillator circuit for generating an oscillator signal which is applied at a third input of said first means, said oscillator signal being routed to said output of said first means in response to a third control signal when said first and second input clock signals are invalid.

9. The phase lock loop of claim 8 wherein said first means includes a multiplexer circuit having first, second and third inputs and an output, said first input being coupled for receiving said first input clock signal, said second input being coupled for receiving said second input clock signal, said third input being coupled for receiving said oscillator signal, said output providing the first digital signal of the PLL in response to said first, second and third control signals.

10. The phase lock loop of claim 9 wherein said second means further includes:

a first clock generator having an input coupled for receiving said first input clock signal and having first and second outputs for providing first and second non-overlapping clock signals, said first non-overlapping clock signal operating in-phase with said first input clock signal, said second non-overlapping clock signal operating of complementary phase with said first input clock signal;

a first frequency divider circuit having first and second inputs coupled for receiving said first and second non-overlapping clock signals from said first clock generator and providing a first frequency-divided clock signal;

a first frequency detector circuit having an input coupled for receiving said first frequency-divided clock signal and providing a first error signal when said first frequency-divided clock signal substantially deviates from a predetermined frequency of operation as determined by said oscillator signal; and a clock selector circuit having a first input coupled for receiving said first error signal and providing said first control signal to said multiplexer circuit when said first frequency-divided clock signal is in the vicinity of said predetermined frequency of operation.

11. The phase lock loop of claim 10 wherein said second means further includes:

a second clock generator having an input coupled for receiving said second input clock signal and having first and second outputs for providing third and fourth non-overlapping clock signals, said third non-overlapping clock signal operating in-phase with said second input clock signal, said fourth non-overlapping clock signal operating of complementary phase with said second input clock signal;

a second frequency divider circuit having first and second inputs coupled for receiving said third and fourth non-overlapping clock signals from said second clock generator and providing a second frequency-divided clock signal; and a second frequency detector circuit having an input coupled for receiving said second frequency-divided clock signal and providing a second error signal when said second frequency-divided clock signal substantially deviates from said predetermined frequency of operation as determined by said oscillator signal.

12. The phase lock loop of claim 11 wherein said clock selector circuit includes a second input coupled for receiving said second error signal and providing said second control signal to said multiplexer circuit when said second frequency-divided clock signal is in the vicinity of said predetermined frequency of operation.

13. A phase lock loop (PLL), comprising:

first means for comparing the phase of first and second digital input signals and generating an output signal to charge and discharge a loop node;

a voltage controlled oscillator having an input coupled for receiving said output signal of said first means and providing a oscillator signal operating at a frequency as determined by said output signal of said first means;

second means having an input coupled for receiving said oscillator signal from said voltage controlled oscillator and dividing down the frequency thereof for providing a first divided-down signal which is applied as said second digital input signal to said first means;

a first multiplexer circuit responsive to first and second control signals for selecting between first and second input clock signals respectively applied at first and second inputs thereof for providing said first digital input signal to said first means at an output; and third means for monitoring validity of said first and second input clock signals by determining duration of a period of the first input clock signal and by determining duration of a period of the second input clock signal, said third means activating said first control signal when said first input clock signal is valid and activating said second control signal when said first input clock signal is invalid.

14. The phase lock loop of claim 13 wherein said third means includes an oscillator circuit for generating an oscillator signal which is applied at a third input of said first multiplexer circuit, said oscillator signal being routed to said output of said first multiplexer circuit in response to a third control signal when said first and second input clock signals are invalid.

15. The phase lock loop of claim 14 further including:
fourth means having an input coupled for receiving said oscillator signal from said voltage controlled oscillator and dividing down the frequency thereof for providing a second divided-down signal; and
a second multiplexer circuit responsive to said third control signal for selecting between said first and second divided-down signals respectively applied at first and second inputs thereof for providing said second digital input signal to said first means.

16. The phase lock loop of claim 15 wherein said third means further includes:
a first clock generator having an input coupled for receiving said first input clock signal and having first and second outputs for providing first and second non-overlapping clock signals, said first non-overlapping clock signal operating in-phase with said first input clock signal, said second non-overlapping clock signal operating of complementary phase with said first input clock signal;
a first frequency divider circuit having first and second inputs coupled for receiving said first and second non-overlapping clock signals from said first clock generator and providing a first frequency-divided clock signal;
a first frequency detector circuit having an input coupled for receiving said first frequency-divided clock signal and providing a first error signal when said first frequency-divided clock signal substantially deviates from a predetermined frequency of operation as determined by said oscillator signal; and
a clock selector circuit having a first input coupled for receiving said first error signal and providing said first control signal to said first multiplexer circuit when said first frequency-divided clock signal is in the vicinity of said predetermined frequency of operation.

17. The phase lock loop of claim 16 wherein said third means further includes:
a second clock generator having an input coupled for receiving said second input clock signal and having first and second outputs for providing third and fourth non-overlapping clock signals, said third non-overlapping clock signal operating in-phase with said second input clock signal, said fourth non-overlapping clock signal operating of complementary phase with said second input clock signal;
a second frequency divider circuit having first and second inputs coupled for receiving said third and fourth non-overlapping clock signals from said second clock generator and providing a second frequency-divided clock signal; and
a second frequency detector circuit having an input coupled for receiving said second frequency-divided clock signal and providing a second error signal when said second frequency-divided clock signal substantially deviates from said predetermined frequency of operation as determined by said oscillator signal.

18. The phase lock loop of claim 17 wherein said clock selector circuit includes a second input coupled for receiving said second error signal and providing said second control signal to said first multiplexer circuit when said second frequency-divided clock signal is in the vicinity of said predetermined frequency of operation.

* * * * *